United States Patent
Karakawa

(10) Patent No.: US 9,245,741 B2
(45) Date of Patent: Jan. 26, 2016

(54) METHOD FOR FORMING NITRIDE FILM USING PLASMA PROCESS

(71) Applicant: TOKYO ELECTRON LIMITED, Tokyo (JP)

(72) Inventor: Takayuki Karakawa, Sendai (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/187,404

(22) Filed: Feb. 24, 2014

(65) Prior Publication Data

US 2014/0242814 A1  Aug. 28, 2014

(30) Foreign Application Priority Data

Feb. 26, 2013  (JP) .................... 2013-036409

(51) Int. Cl.
| | |
|---|---|
| H01L 21/00 | (2006.01) |
| H01L 21/02 | (2006.01) |
| C23C 16/34 | (2006.01) |
| C23C 16/455 | (2006.01) |
| C23C 16/511 | (2006.01) |

(52) U.S. Cl.
CPC .......... *H01L 21/0217* (2013.01); *C23C 16/345* (2013.01); *C23C 16/45542* (2013.01); *C23C 16/45551* (2013.01); *C23C 16/511* (2013.01); *H01L 21/0228* (2013.01); *H01L 21/02211* (2013.01); *H01L 21/02274* (2013.01)

(58) Field of Classification Search
CPC ............... H01L 21/0217; H01L 21/02274; C23C 16/511; C23C 16/345
See application file for complete search history.

(56) References Cited

U.S. PATENT DOCUMENTS

| | | | |
|---|---|---|---|
| 8,343,594 B2 * | 1/2013 | Hasebe et al. ................. 427/579 |
| 2011/0086516 A1 | 4/2011 | Lee et al. | |
| 2012/0009802 A1 * | 1/2012 | LaVoie et al. ................ 438/783 |
| 2012/0322168 A1 * | 12/2012 | Liu et al. .......................... 438/5 |
| 2013/0023128 A1 * | 1/2013 | Fujikura ...................... 438/716 |
| 2013/0025531 A1 * | 1/2013 | Capano .......................... 117/95 |

FOREIGN PATENT DOCUMENTS

| | | |
|---|---|---|
| JP | 2006-278497 A | 10/2006 |
| JP | 2007-281082 A | 10/2007 |
| JP | 2010-283357 A | 12/2010 |
| JP | 2011-61218 A | 3/2011 |
| JP | 2012-79919 A | 4/2012 |

* cited by examiner

*Primary Examiner* — Kimberly Rizkallah
*Assistant Examiner* — Alexander Belousov
(74) *Attorney, Agent, or Firm* — Rothwell, Figg, Ernst & Manbeck, P.C.

(57) ABSTRACT

Disclosed is a method of forming a nitride film on an object to be processed ("processed object"). The method includes a step (step (a)) of exposing the processed object to dichlorosilane which is a precursor gas and a step (step (b)) of exposing the processed object to plasma of a processing gas which includes an ammonia gas and a hydrogen gas after step (a). Alternatively, step (a) and step (b) may be alternately repeated and a step of removing dichlorosilane (step (c)) may be further provided between step (a) and step (b).

5 Claims, 17 Drawing Sheets

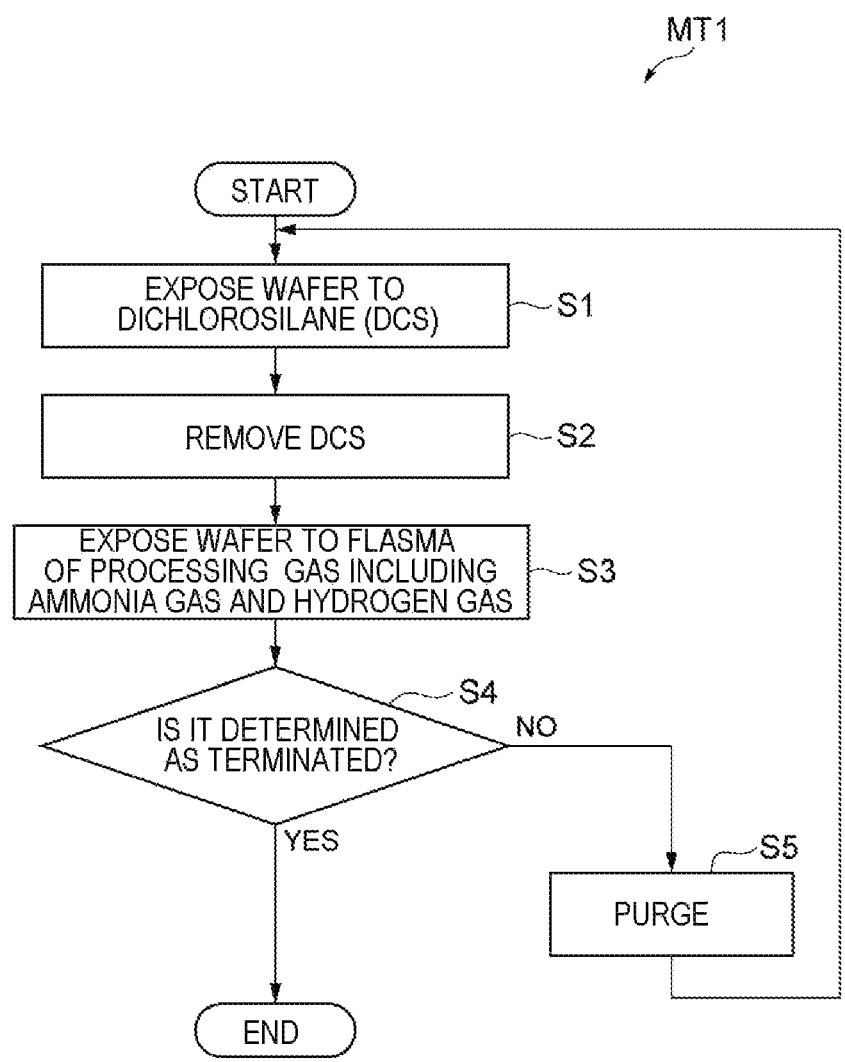

METHOD FOR FORMING NITRIDE FILM USING PLASMA PROCESS

CROSS-REFERENCE TO RELATED APPLICATIONS

This application is based on and claims priority from Japanese Patent Application No. 2013-036409 filed on Feb. 26, 2013 with the Japan Patent Office, the disclosure of which is incorporated herein in its entirety by reference.

TECHNICAL FIELD

The present invention relates to a method for forming a nitride film.

BACKGROUND

When a device such as a semiconductor device is manufactured, a film is formed on an object to be processed ("processed object"). As a method of forming a film, a plasma enhanced-atomic layer deposition ("PE-ALD") method has attracted attention in recent years. For example, Japanese Patent Application Laid-Open No. 2006-278497 discloses a PE-ALD method.

The PE-ALD method disclosed in Japanese Patent Application Laid-Open No. 2006-278497 forms a nitride film. Specifically, the PE-ALD method disclosed in Japanese Patent Application Laid-Open No. 2006-278497 includes supplying dichlorosilane into a reaction tube in which a wafer is accommodated (step 1), supplying hydrogen radicals into the reaction tube (step 2), and then supplying ammonia radicals into the reaction tube (step 3). In the PE-ALD method, step 1, step 2, and step 3 are sequentially performed at each of plural cycles. According to the PE-ALD method, a dichlorosilane based reactant is adsorbed onto the wafer in step 1 and hydrogen is substituted for chlorine included in the reactant in step 2 and a nitriding treatment is performed in step S3. Therefore, a nitride film of high quality, that is, a nitride film with a small wet etching rate ratio ("WERR") is small, may be formed. In the meantime, the WERR is a scale of quality of a film to be evaluated and a ratio of a wet etching rate of a film to be evaluated by hydrofluoric acid with respect to a wet etching rate of a thermally oxidized film by hydrofluoric acid. When a film to be evaluated has a small WERR, the film is evaluated as a film of high quality.

SUMMARY

The present disclosure provides a method of forming a nitride film on an object to be processed ("processed object"). The method includes: exposing the processed object to dichlorosilane which is a precursor gas; and exposing the processed object to plasma of a processing gas which includes an ammonia gas and a hydrogen gas, after the exposing to dichlorosilane.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 1 is a flowchart illustrating a method of forming a nitride film according to an exemplary embodiment.

DETAILED DESCRIPTION

Figure 2A:
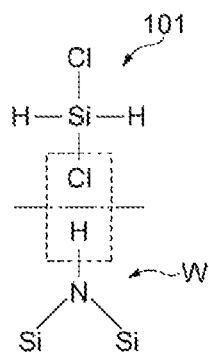
FIGS. 2A to 2E are views illustrating a reaction in the method illustrated in FIG. 1.

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made without departing from the spirit or scope of the subject matter presented here.

In the PE-ALD method disclosed in Japanese Patent Application Laid-Open No. 2006-278497, in order to remove chlorine from a dichlorosilane based reactant, it is required to a wafer to hydrogen radicals for a long time. However, when the time for exposing the wafer to the hydrogen radicals is long, the time for exposing the wafer to the ammonia radicals is short and thus, a nitriding time in one cycle becomes short. As a result, the thickness of a nitride film which may be formed during one cycle is thin. Meanwhile, when a time for exposing a processed object to the hydrogen radicals is short, the WERR of a nitride film to be formed is large. That is, the quality of the nitride film to be formed is degraded.

Therefore, what is requested in the related technical field is to provide a method of forming a nitride film of high quality with a high throughput.

An aspect of the present invention provides a method of forming a nitride film on a processed object. The method includes a step (step (a)) of exposing the processed object to dichlorosilane which is a precursor gas and a step (step (b)) of exposing the processed object to plasma of a processing gas which includes an ammonia gas and a hydrogen gas after step (a). In one exemplary embodiment, step (a) and step (b) are alternately repeated and a step of removing dichlorosilane (step (c)) may be further provided between step (a) and step (b).

In the method as described above, in step (a), a dichlorosilane based reactant is adsorbed onto the processed object. In step (b), the ammonia gas and the hydrogen gas are included in the processing gas so that a reaction of substituting hydrogen for chlorine in the reactant and nitriding of the reactant are concurrently performed. Accordingly, in step (b), a length of time for progressing the reaction of substituting hydrogen for chlorine in the reactant and a length of time for nitriding the reactant may be relatively long. Further, in step (b), the ammonia gas is used rather than a nitrogen gas so that the consumption of hydrogen radicals due to the coupling with the nitrogen radicals is suppressed. As a result, according to this method, a nitride film of high quality may be formed with a high throughput.

In an exemplary embodiment, with respect to the flow rate of the hydrogen gas in step (b), the flow rate of the ammonia gas in step (b) is smaller than a flow rate which is defined as follows: a flow rate of the hydrogen gas:a flow rate of the ammonia gas=7:2. According to this exemplary embodiment, an amount of hydrogen radicals which are produced in step (b) may be increased and thus an amount of chlorine atoms in the reactant which are substituted with the hydrogen radicals may be increased. As a result, it is possible to form a nitride film with a smaller WERR, that is, a nitride film of higher quality.

According to an exemplary embodiment, a processed object is disposed on a mounting table which is installed to be rotatable about an axis in a processing container and sequentially passes through a first region and a second region in the processing container around the axis in accordance with rotation of the mounting table, dichlorosilane is supplied to the first region, and the plasma of the processing gas is produced in the second region. According to the exemplary embodiment, step (a) and step (b) are performed by rotating the processed object about the axis. According to the present exemplary embodiment, when a plurality of processed objects are arranged in a circumferential direction with respect to the axis, the plurality of processed objects may be simultaneously formed with the nitride film. Therefore, according to the present exemplary embodiment, the throughput of the nitride film formation may be further improved.

In an exemplary embodiment, the processing gas may be excited by a microwave. The microwave may excite the processing gas over a pressure range which is wider than a pressure range where the processing gas may be excited by a plasma source such as inductive coupling or capacitive coupling. For example, the microwave may excite the processing gas at a high pressure where other plasma sources cannot excite the processing gas. Therefore, when the microwave is used as the plasma source, the method as described above may be performed at a pressure which is selected from a wide pressure range.

As described above, according to an aspect and various exemplary embodiments of the present invention, a method capable of forming a nitride film of high quality with a high throughput is provided.

Hereinafter, various exemplary embodiments will be described in detail with reference to the drawings. The same or like parts will be denoted by the same reference numerals in the drawings.

FIG. 1 is a flowchart illustrating a method of forming a nitride film according to an exemplary embodiment. Further, FIGS. 2A to 2E are views illustrating a reaction in the method (MT1) illustrated in FIG. 1. Hereinafter, a method (MT1) of forming a nitride film according to an exemplary embodiment will be described with reference to FIG. 1 and FIGS. 2A to 2E. In the method (MT1) illustrated in FIG. 1, in step S1, a precursor gas is supplied into a processing container. Therefore, in step S1, a processed object ("wafer") is exposed to the precursor gas. In the method (MT1), the precursor gas is dichlorosilane ($DCS:SiH_2Cl_2$).

Figure 2B:
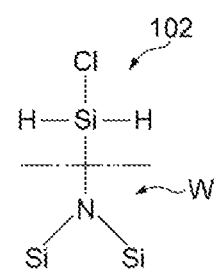

In step S1, as illustrated in FIG. 2A, hydrogen atoms (H) on a surface of a wafer W is reacted with chlorine (Cl) of dichlorosilane (denoted by reference number 101 in the figure). As a result, as illustrated in FIG. 2B, a dichlorosilane based reactant 102 is chemisorbed onto the wafer W. In the meantime, hydrogen chloride (HCl) which is produced by the reaction of the hydrogen atoms (H) on the surface of the wafer W and chlorine (Cl) in dichlorosilane is released from the surface of the wafer W.

Referring to FIG. 1 again, in the method (MT1), the DCS is removed in subsequent step S2. In the exemplary embodiment, in step S2, the DCS which is over-adsorbed onto the wafer W, for example, the DCS which is physically adsorbed onto the wafer W, is removed.

In the method (MT1), the wafer W is exposed to plasma of a processing gas in subsequent step S3. In step S3, the processing gas which includes ammonia ($NH_3$) gas and hydrogen ($H_2$) gas is supplied into the processing container and the processing gas is excited to produce plasma. The plasma includes hydrogen radicals which are produced when the hydrogen gas is excited. Further, the plasma includes nitrogen (N) radicals as well as the ammonia radicals which are produced when the ammonia gas is excited, that is, $NH_2$ and NH. Further, the plasma includes hydrogen radicals which are produced when the ammonia gas is excited.

Figure 2C:
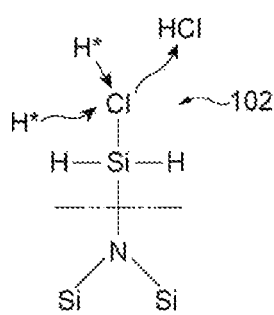

In step S3, as illustrated in FIG. 2C, chlorine is released from the reactant 102 by the reaction of the hydrogen radical (represented by "H*" in the figures) in the plasma and chlorine (Cl) of the reactant 102. HCl is produced by the reaction and the HCl is released from the wafer W. Further, in step S3, as illustrated in FIG. 2C, a chlorine group in the reactant 102 is substituted by the hydrogen radical (H*). Accordingly, in step S3, the chlorine in the reactant 102 is removed. Hereinafter, the reaction illustrated in FIG. 2C is referred to as a "hydrogen substitution reaction". The reactant 102 illustrated in FIG. 2C becomes a reactant 104 illustrated in FIG. 2D by the hydrogen substitution reaction.

Figure 2D:
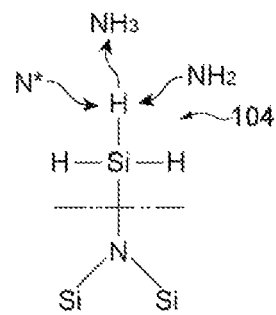
Figure 2E:
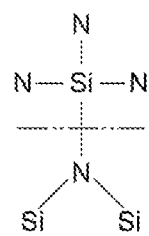

In step S3, as illustrated in FIG. 2D, the hydrogens of the reactant 104 on the surface of the wafer W and the ammonia radicals ($NH_2$) are reacted. Therefore, $NH_3$ is released from the reactant 104. Further, a hydrogen terminal of the reactant 104 is substituted by a nitrogen radical (represented by "N*" in the drawing). As a result, as illustrated in FIG. 2E, silicon nitride is produced. Hereinafter, the reaction illustrated in FIG. 2D will be referred to as a "nitriding reaction".

Referring to FIG. 1 again, in the method (MT1), in subsequent step S4, it is determined whether to repeat steps S1 to S3. In step S4, when a predetermined termination condition is satisfied, the method (MT1) is terminated. Meanwhile, when the predetermined termination condition is not satisfied in step S4, step S5 is performed. In an exemplary embodiment, a purge process is performed in step S5. The purge process is a processing of substituting an atmosphere on the wafer W. Following step S5, in the method (MT1), steps S1 to S3 are further repeated. Further, when the cycle of steps S1 to S3 is repeated a predetermined number of times, it may be determined that the termination condition is satisfied.

According to the method (MT1) as described above, in step S3, the hydrogen substitution reaction and the nitriding reaction are concurrently progressed. Therefore, a time for use in hydrogen substitution reaction and a time for use in nitriding reaction may be increased to be relatively long. As a result, the removal of chlorine from the dichlorosilane based reactant may be facilitated. Further, in step S3, the ammonia gas is used rather than nitrogen gas. Thus, the ammonia radicals are produced by the dissociation of the ammonia gas rather than by the bond of the nitrogen radicals and the hydrogen radicals. Therefore, the consumption of the hydrogen radicals is suppressed and the removal of the chlorine from the dichlorosilane based reactant is facilitated. Therefore, according to the method (MT1), a nitride film of high quality may be formed with a high throughput.

In an exemplary embodiment, with respect to the flow rate of the hydrogen gas in step 3, the flow rate of the ammonia gas in step S3 may be smaller than a flow rate which is defined as follows: a flow rate of the hydrogen gas:a flow rate of the ammonia gas=7:2. According to the present exemplary embodiment, the amount of the hydrogen radicals which are produced in step S3 may be increased and the amount of chlorine in the reactant which is substituted with the hydrogen radicals may be increased. As a result, it is possible to form a nitride film with a smaller WERR, that is, a nitride film of higher quality.

More specifically, the dissociation of ammonia may be described by four Equations (i) to (iv) as follows:

$$NH_3 \rightarrow N + H_2 + H (7.7\ eV), \quad (i)$$

$$NH_3 \rightarrow NH + H_2 (3.9\ eV), \quad (ii)$$

$$NH_3 \rightarrow NH_2 + H (4.5\ eV), \text{ and} \quad (iii)$$

$$H + NH_3 \rightarrow NH_2 + H_2 (-0.04\ eV). \quad (iv)$$

Energies (eV) in the parentheses in Equations (i) to (iv) are energies required for dissociations represented by the equations, respectively.

In the total amount of ammonia ($NH_3$) which is supplied to the processing container, ammonia to be dissociated is several % thereof. Thus, it is considered that the dissociation of Equation (ii), which requires a low energy for dissociation, may occur without being substantially changed even if the flow rate of the ammonia gas is reduced, due to the low dependency on the flow rate of the ammonia gas.

When the flow rate of the ammonia gas is relatively reduced as compared with the flow rate of the hydrogen gas, the energy which may be used for the dissociation of Equation (i) is relatively increased. The dissociation of Equation (i) requires a higher energy. With respect to the flow rate of the hydrogen gas in step 3, when the flow rate of the ammonia gas in step S3 is smaller than a flow rate which is defined as follows: a flow rate of the hydrogen gas:the flow rate of the ammonia gas=7:2, it is considered that the dissociation of Equation (i) is relatively increased. As a result, the amount of the hydrogen radicals to be produced is increased and an amount of chlorine in the reactant to be substituted with the hydrogen radicals may be increased. Therefore, it is possible to form a nitride film with a smaller WERR, that is, a nitride film of higher quality.

In the exemplary embodiment, in step S3, the processing gas may be excited by a microwave, thereby producing plasma. A pressure range where the processing gas is excited by the microwave is wider than a pressure range where the processing gas may be excited by a plasma source such as inductive coupling or capacitive coupling. For example, the microwave may excite the processing gas even at a high pressure where other plasma sources cannot excite the processing gas. Therefore, when the microwave is used as the plasma source, the method (MT1) may be performed at a pressure which may be selected from a wide pressure range.

Hereinafter, various examples of a film forming device which may be used to carry out the method (MT1) will be described.

Figure 3:
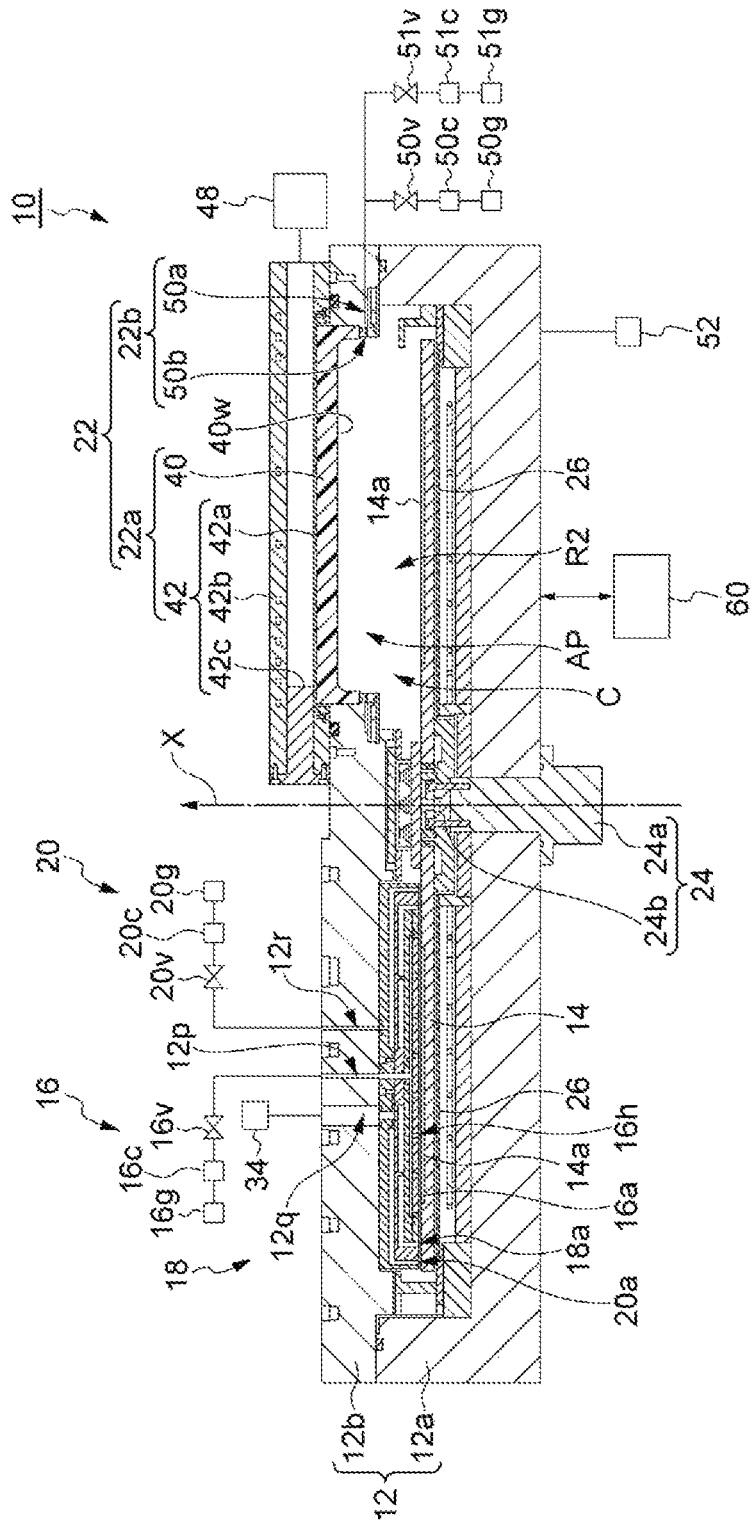
FIG. 3 is a view illustrating an example of a film forming device which is used to carry out the method illustrated in FIG. 1.
Figure 4:
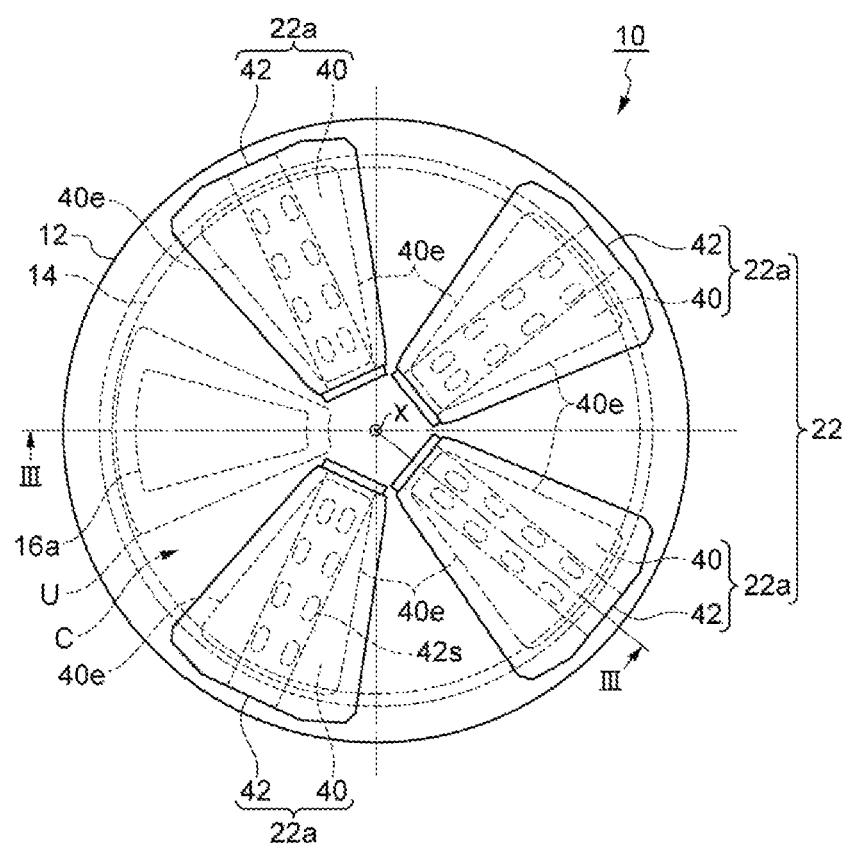
FIG. 4 is a top plan view schematically illustrating the film forming device illustrated in FIG. 3.
Figure 5:
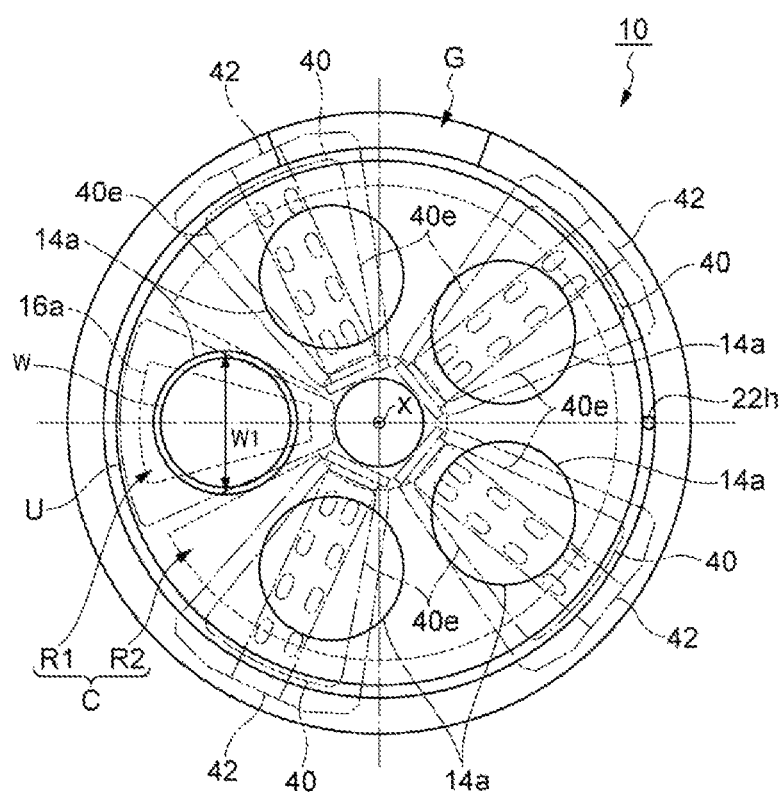
FIG. 5 is a plan view illustrating the film forming device illustrated in FIG. 4 in a state where a top portion of a processing container is removed therefrom.

FIG. 3 is a view illustrating an example of a film forming device which may be used to carry out the method illustrated in FIG. 1 in which a cross-section of the device is schematically illustrated. FIG. 4 is a top view schematically illustrating the film forming device illustrated in FIG. 3. FIG. 3 illustrates a cross-section taken along line III-III of FIG. 4. FIG. 5 is a plan view illustrating the film forming device in a state where a top portion of a processing container is removed from the film forming device illustrated in FIG. 4.

The film forming device 10 illustrated in FIGS. 3, 4, and 5 is a so-called semi-batch type film forming device and includes a processing container 12, a mounting table 14, a first gas supplying unit 16, an exhausting unit 18, a second gas supplying unit 20, and a plasma generating unit 22.

The processing container 12 is a substantially cylindrical container which extends in an axis X direction. The processing container 12 includes a processing chamber C which is formed therein. According to an exemplary embodiment, as illustrated in FIG. 3, the processing container 12 includes a lower portion 12a and an upper portion 12b. The lower portion 12a has a cylinder shape of which the top side is opened and includes a side wall and a bottom wall which form the processing chamber C. The upper portion 12b is a lid which forms the processing chamber C from the top side. The upper portion 12b is attached onto the top of the lower portion 12a so as to close the top opening of the lower portion 12a. An elastic sealing member may be provided between the lower portion 12a and the upper portion 12b so as to seal the processing chamber C.

The mounting table 14 is provided in the processing chamber C which is formed by the processing container 12. The mounting table 14 has a substantially disc shape. The mounting table 14 is configured so as to be rotatable around the axis X. In the exemplary embodiment, the mounting table 14 is rotatably driven around the axis X by a driving mechanism 24. The driving mechanism 24 includes a driving device 24a such as a motor and a rotary shaft 24b and is attached onto the lower portion 12a of the processing container 12. The rotary shaft 24b extends into the processing chamber C with the axis X as a central axis and rotates about the axis X by a driving force from the driving device 24a. A central portion of the mounting table 14 is supported by the rotary shaft 24b.

Accordingly, the mounting table 14 rotates about the axis X. Further, an elastic sealing member such as an O ring may be provided between the lower portion 12a of the processing container 12 and the driving mechanism 24 so as to seal the processing chamber C.

As illustrated in FIGS. 3 and 5, one or more mounting areas 14a are provided on the top surface of the mounting table 14. According to the exemplary embodiment, a plurality of mounting areas 14a are arranged in a circumferential direction with respect to the axis X. The mounting areas 14a are configured as concave portions having a diameter which is substantially equal to or slightly larger than a diameter of wafers W to be disposed in the mounting areas 14a. A heater 26 configured to heat the wafers W disposed in the mounting areas 14a is provided below the mounting table 14 in the processing chamber C. The wafers W are conveyed into the processing chamber C by a conveying device such as a robot arm through a gate valve G which is provided in the processing chamber C, and disposed in the mounting areas 14a, respectively. Further, after being processed by the film forming device 10, the wafers W are taken out from the processing chamber C through the gate valve G by the conveying device. The processing chamber C includes one or more first regions R1 and one or more second regions R2 which are arranged in the circumferential direction with respect to the axis X. Accordingly, the wafers W disposed in the mounting areas 14a pass through the first regions R1 and the second regions R2 in sequence in accordance with the rotation of the mounting table 14.

Figure 6:
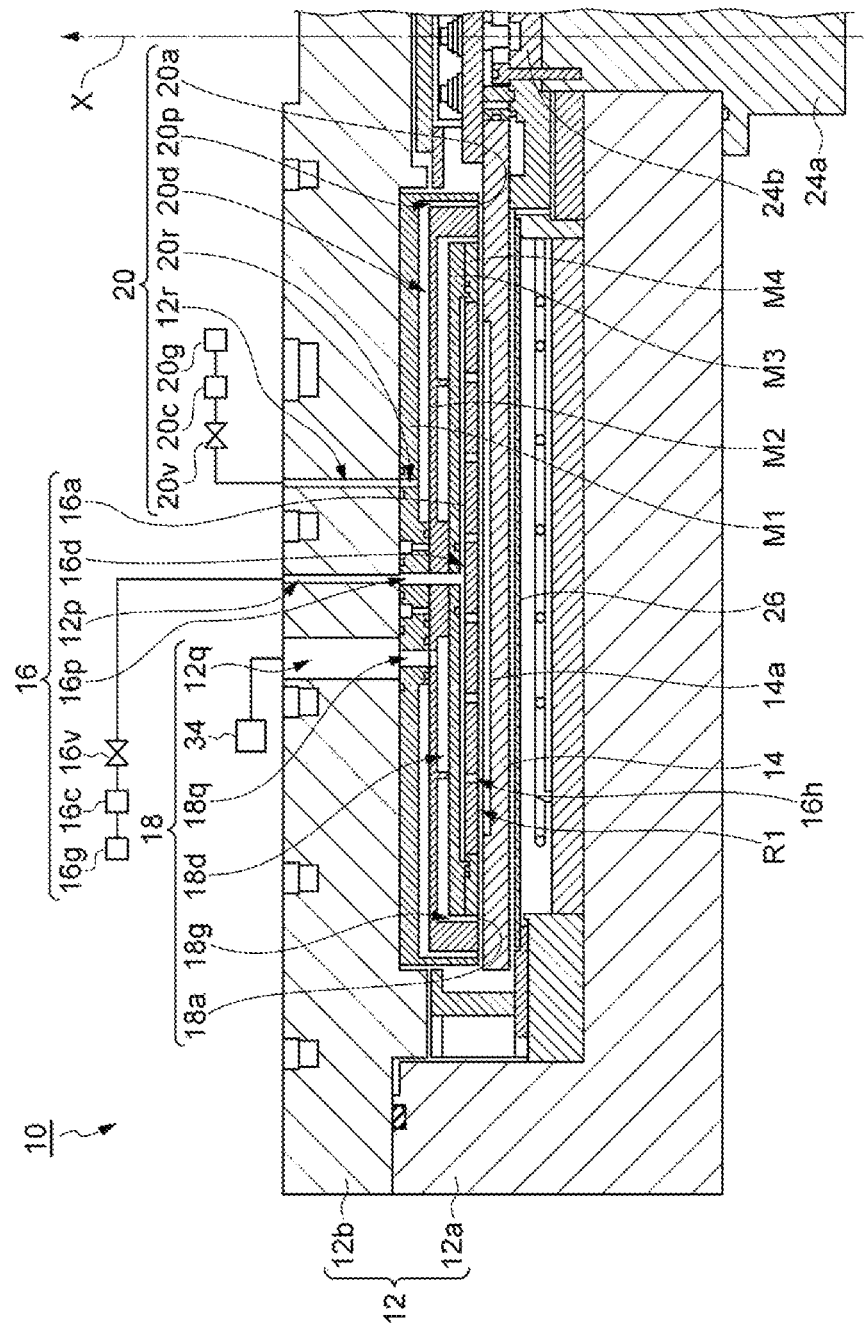
FIG. 6 is an enlarged cross-sectional view of the film forming device illustrated in FIG. 3, in which a portion where an injection unit of a first gas supplying unit, an exhaust port of an exhausting unit, and an injection nozzle of a second gas supplying unit are formed is illustrated in an enlarged scale.
Figure 7:
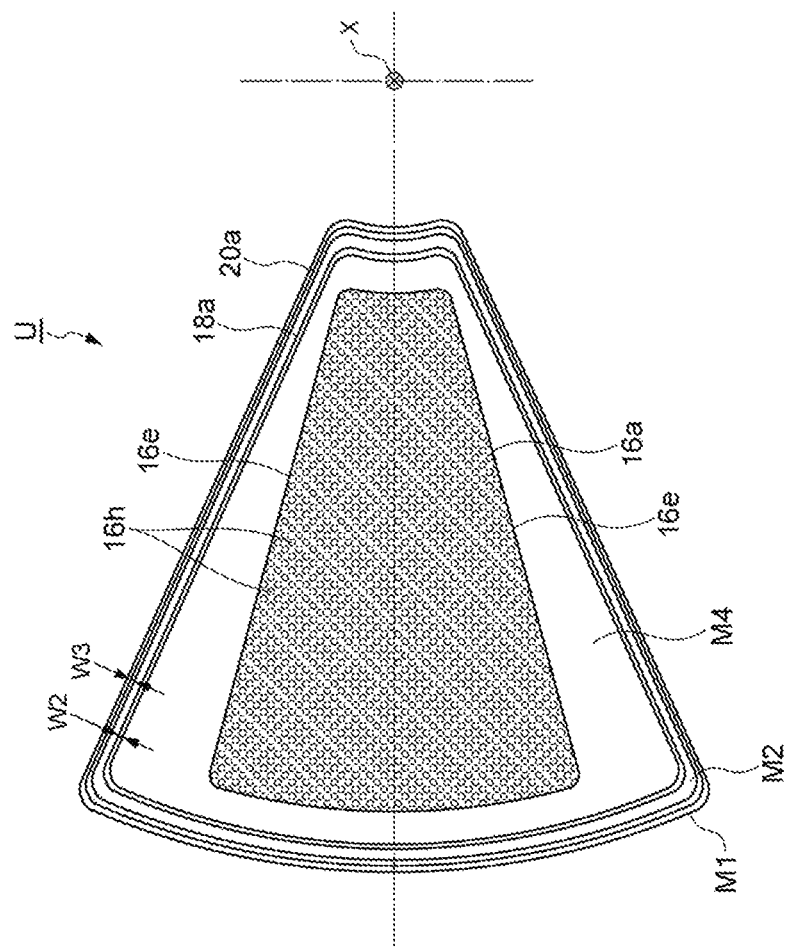
FIG. 7 is a bottom plan view illustrating an injection unit of a first gas supplying unit, an exhaust port of an exhausting unit, and an injection nozzle of a second gas supplying unit of the film forming device illustrated in FIG. 3, in which the injection unit of the first gas supplying unit, the exhaust port of the exhausting unit, and the injection nozzle of the second gas supplying unit are viewed from the bottom side, that is, a mounting table side.

Hereinafter, reference will be made to FIGS. 6 and 7 in addition to FIGS. 4 and 5. FIG. 6 is an enlarged cross-sectional view of the film forming device illustrated in FIG. 3, in which a portion in which an injection unit of a first gas supplying unit, an exhaust port of an exhausting unit, and an injection nozzle of a second gas supplying unit are provided is illustrated in an enlarged scale. FIG. 7 is a top plan view illustrating an injection unit of a first gas supplying unit, an exhaust port of an exhausting unit, and an injection nozzle of a second gas supplying unit of the film forming device of FIG. 3 in which the injection unit of the first gas supplying unit, the exhaust port of an exhausting unit, and the injection nozzle of the second gas supplying unit are viewed from the bottom side, that is, the mounting table side. As illustrated in FIGS. 4 to 6, an injection unit 16a of the first gas supplying unit 16 is provided above each of the first regions R1 to face the top surface of the mounting table 14. In other words, regions which face the injection units 16a, among the regions included in the processing chamber C, become the first regions R1.

As illustrated in FIGS. 6 and 7, each injection unit 16a includes a plurality of injection nozzles 16h. The first gas supplying unit 16 supplies a precursor gas from a plurality of injection nozzles 16h to a first region R1. When the precursor gas is supplied into the first region R1, the precursor gas is chemisorbed onto a surface of the wafer W which passes through the first region R1. When the method (MT1) is carried out in the film forming device 10, dichlorosilane (DCS) may be used as the precursor gas.

According to the exemplary embodiment, as illustrated in FIG. 7, edges that define an injection unit 16a includes two edges 16e which define the injection unit 16a from the circumferential direction. The two edges 16e extend approach each other toward the axis X. The two edges 16e may extend, for example, in a radial direction with respect to the axis X. That is, the injection unit 16a may have a substantially fan shape in a plan view. The plurality of injection nozzles 16h are formed between the two edges 16e. Here, a circumferential speed of each position in a wafer W according to the rotation of the mounting table 14 varies depending on a distance from the axis X. That is, as a position is distant from the axis X, the circumferential speed at the position increases. In the exemplary embodiment, the injection unit 16a is configured such that, as a position in the wafer W is distant from the axis X, the injection unit 16a faces more injection nozzles 16h at the position. Therefore, the variation in time for allowing respective positions on the wafer W to be exposed to the precursor gas may be reduced.

As illustrated in FIGS. 6 and 7, an exhaust port 18a is provided around the injection unit 16a and the exhausting unit 18 exhausts the first region R1 from the exhaust port 18a. The exhaust port 18a of the exhausting unit 18 faces the top surface of the mounting table 14 and, as illustrated in FIG. 5, extends along a closed path which encloses an outer periphery of the injection unit 16a. As described above, in the film forming device 10, the exhaust port 18a having a small width encloses the periphery of the injection unit 16a.

As illustrated in FIGS. 6 and 7, an injection nozzle 20a of a second gas supplying unit 20 is provided around the exhaust port 18a and the second gas supplying unit 20 injects a purge gas from the injection nozzle 20a. The injection nozzle 20a of the second gas supplying unit 20 faces the top surface of the mounting table 14 and extends along a closed path which encloses an outer periphery of the exhaust port 18a. As for a purge gas which is supplied by the second gas supplying unit 20, an inert gas, for example, nitrogen ($N_2$) gas or a rare gas such as argon (Ar) gas may be used. When such a purge gas is injected onto a wafer W, the precursor gas which is excessively adsorbed onto the wafer W is removed from the wafer W.

In the film forming device 10, by the exhaust from the exhaust port 18a and the injection of the purge gas from the injection nozzle 20a, the precursor gas supplied to a corresponding first region R1 is suppressed from leaking to the outside of the first region R1, and further, the processing gas or radicals thereof supplied below into a corresponding second region R2 as described is suppressed from infiltrating into the first region R1. That is, the exhausting unit 18 and the second gas supplying unit 20 separate the first region R1 and the second region R2. Further, each of the injection nozzle 20a and the exhaust port 18a has a strip shape in a planar view which extends along a closed path which encloses the outer periphery of the injection unit 16a. Therefore, each of the injection nozzle 20a and the exhaust port 18a has a narrow width. Accordingly, the first region R1 and the second region R2 may be separated from each other while securing an angular range of the second region R2 which extends to the circumferential direction with respect to the axis X. According to the exemplary embodiment, the width W2 of the exhaust port 18a and the width W3 of the injection nozzle 20a (see FIG. 7) which extend between the first region R1 and the second region R2 are smaller than the diameter W1 of the corresponding mounting area 14a (see FIG. 5).

Figure 8:
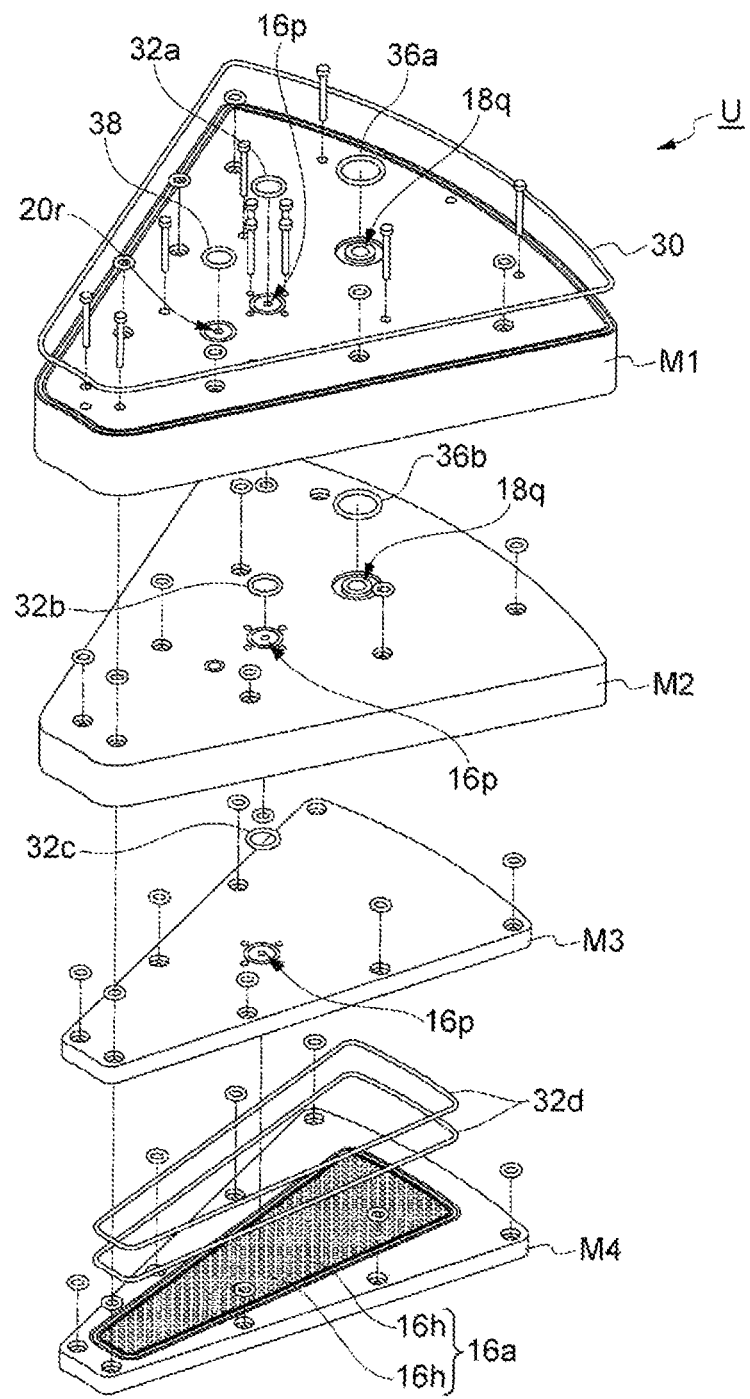
FIG. 8 is an exploded perspective view of a unit assembly according to an exemplary embodiment which forms the injection unit of the first gas supplying unit, the exhaust port of the exhausting unit, and the injection nozzle of the second gas supplying unit.
Figure 9:
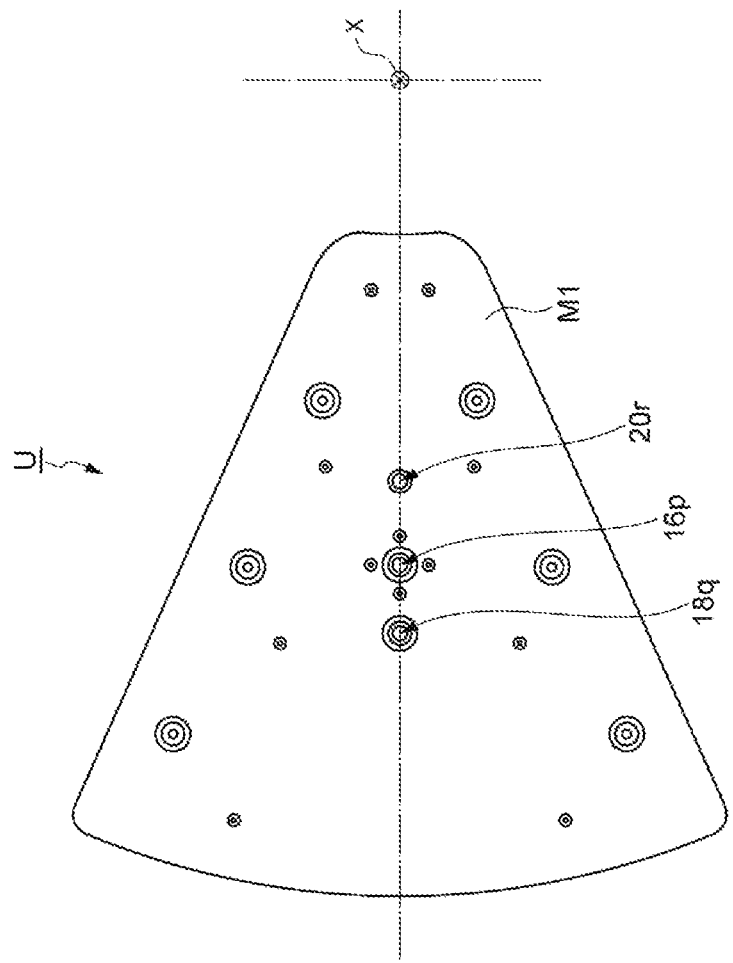
FIG. 9 is a top plan view of the unit assembly illustrated in FIG. 8.

According to the exemplary embodiment, the film forming device 10 may include a unit assembly U which forms a injection unit 16a, an exhaust port 18a, and a injection nozzle 20a. Hereinafter, reference will also be made to FIGS. 8 and 9. FIG. 8 is an exploded perspective view of the unit assembly U according to an exemplary embodiment which forms an injection unit of the first gas supplying unit, an exhaust port of the exhausting unit, and an injection nozzle of the second gas supplying unit. FIG. 9 is a top plan view of the unit assembly U of FIG. 8. Further, the top surface of the unit assembly U is illustrated in FIG. 9 and the bottom surface of the unit assembly U is illustrated in FIG. 7. As illustrated in FIGS. 6 to 9, the unit assembly U is configured by a first member M1, a second member M2, a third member M3, and a fourth member M4 and the first to fourth members M1 to M4 are stacked sequentially from the top. The unit assembly U is attached to the processing container 12 to be in contact with the bottom surface of the upper portion 12b of the processing container 12 and an elastic sealing member 30 is provided between the bottom surface of the upper portion 12b of the processing container 12 and the first member M1. The elastic sealing member 30 extends along the outer edges of the top surface of the first member M1.

The first to fourth members M1 to M4 have a substantially fan-shaped in a plan view. The first member M1 has a concave portion on the bottom side thereof in which the second to fourth members M2 to M4 are accommodated. Further, the second member M2 has a concave portion on the bottom side thereof in which the third and fourth members M3 and M4 are accommodated. The third member M3 and the fourth member M4 have substantially the same planar size.

A gas supply path 16p which passes through the first to third members M1 to M3 is provided in the unit assembly U. An upper end of the gas supply path 16p is connected to a gas supply path 12p which is provided in the upper portion 12b of the processing container 12. A gas source 16g of the precursor gas is connected to the gas supply path 12p through a valve 16v and a flow rate controller 16c such as a mass flow controller. Further, a lower end of the gas supply path 16p is connected to a space 16d which is formed between the third member M3 and the fourth member M4. The injection nozzle 16h of the injection unit 16a which is provided in the fourth member M4 is connected to the space 16d.

An elastic sealing member 32a such as an O ring is provided between the upper portion 12b of the processing container 12 and the first member M1 so as to enclose a portion where the gas supply path 12p and the gas supply path 16p are connected. The elastic sealing member 32a may prevent the precursor gas supplied to the gas supply path 16p and the gas supply path 12p from leaking from a boundary of the upper portion 12b of the processing container 12 and the first member M1. Further, elastic sealing members 32b and 32c such as O rings are provided between the first member M1 and the second member M2 and between the second member M2 and the third member M3, respectively, to enclose the gas supply path 16p. The elastic sealing members 32b and 32c may prevent the precursor gas supplied to the gas supply path 16p from leaking from a boundary of the first member M1 and the second member M2 and a boundary of the second member M2 and the third member M3. Further, an elastic sealing member 32d is provided between the third member M3 and the fourth member M4 to enclose the space 16d. The elastic sealing member 32d may prevent the precursor gas supplied to the space 16d from leaking from a boundary of the third member M3 and the fourth member M4.

An exhaust path 18q which passes through the first and second members M1 and M2 is further provided in the unit assembly U. An upper end of the exhaust path 18q is connected to an exhaust path 12q which is formed in the upper portion 12b of the processing container 12. The exhaust path 12q is connected to an exhausting device 34 such as a vacuum pump. Further, a lower end of the exhaust path 18q is connected to a space 18d which is provided between a bottom surface of the second member M2 and a top surface of the third member M3. Further, as described above, the second member M2 has a concave portion in which the third member M3 and the fourth member M4 are accommodated and a gap 18g is provided between an inner surface of the second member M2 in which the concave portion is formed and side edges of the third member M3 and the fourth member M4. The space 18d is connected to the gap 18g. A lower end of the gap 18g serves as the above-described exhaust port 18a.

An elastic sealing member 36a such as an O ring is provided between the upper portion 12b of the processing container 12 and the first member M1 to enclose a portion where the exhaust path 18q and the exhaust path 12q are connected. The elastic sealing member 36a may prevent the exhausted gas which passes through the exhaust path 18q and the exhaust path 12q from leaking from the boundary of the upper portion 12b of the processing container 12 and the first member M1. Further, an elastic sealing member 36b such as an O ring is provided between the first member M1 and the second member M2 to enclose the exhaust path 18q. The elastic sealing member 36b may prevent the gas which passes through the exhaust path 18q from leaking from the boundary of the first member M1 and the second member M2.

A gas supply path 20r which passes through the first member M1 is provided in the unit assembly U. An upper end of the gas supply path 20r is connected to a gas supply path 12r which is provided in the upper portion 12b of the processing container 12. A gas source 20g of the purge gas is connected to the gas supply path 12r through a valve 20v and a flow rate controller 20c such as a mass flow controller. Further, a lower end of the gas supply path 20r is connected to a space 20d which is provided between the bottom surface of the first member M1 and the top surface of the second member M2. Further, as described above, the first member M1 includes a concave portion in which the second to fourth members M2 to M4 are accommodated and a gap 20p is provided between the inner surface of the first member M1 in which the concave portion is formed and a side of the second member M2. The gap 20p is connected to the space 20d. Further, a lower end of the gap 20p serves as an injection nozzle 20a of the second gas supplying unit 20. An elastic sealing member 38 such as an O ring is provided between the upper portion 12b of the processing container 12 and the first member M1 to enclose a portion where the gas supply path 12r and the gas supply path 20r are connected. The elastic sealing member 38 may prevent the purge gas which passes through the gas supply path 20r and the gas supply path 12r from leaking from the boundary of the upper portion 12b and the first member M1.

Figure 10:
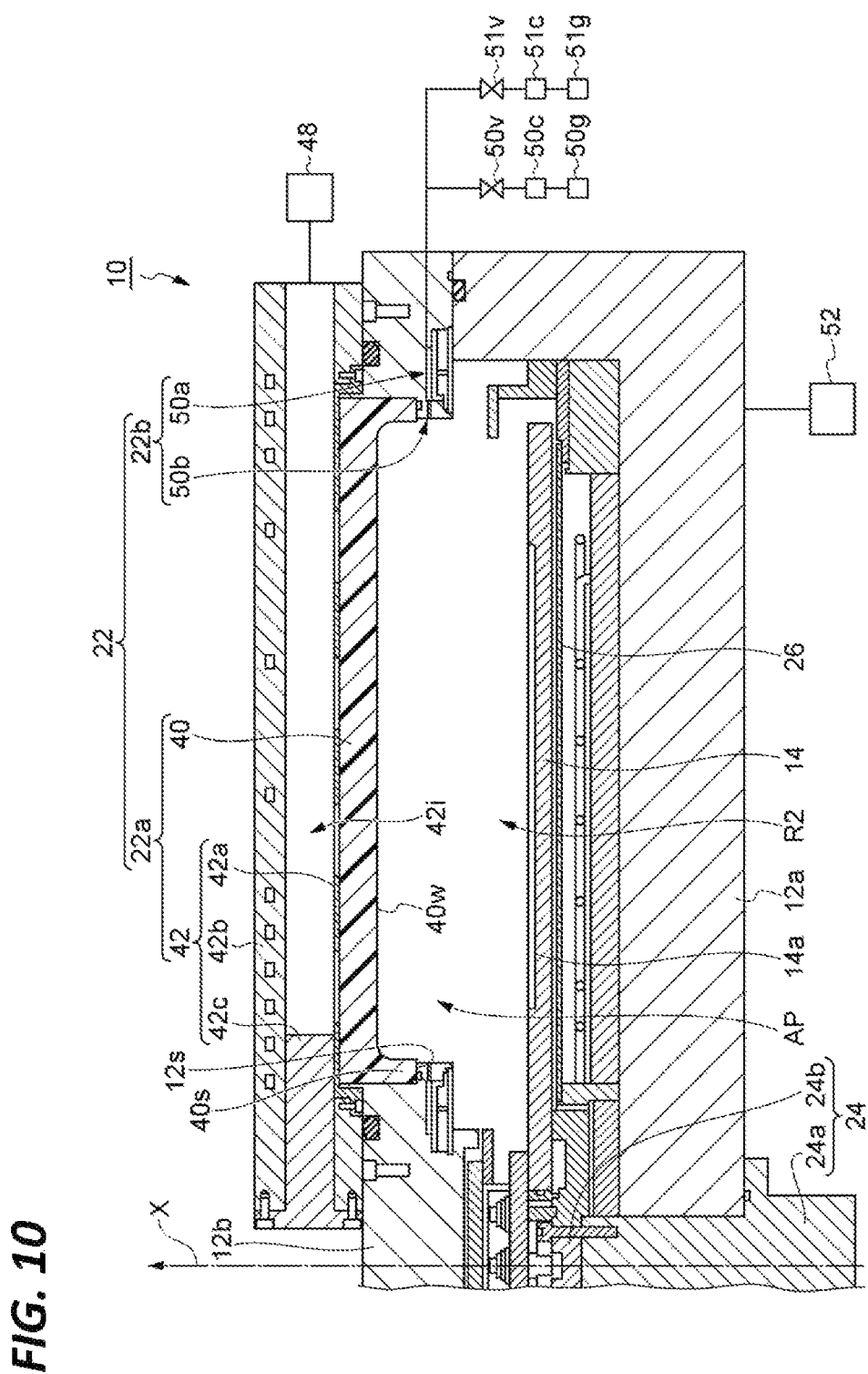
FIG. 10 is an enlarged cross-sectional view of the film forming device illustrated in FIG. 3, in which a portion where a plasma generating unit is provided is illustrated in an enlarged scale.

Hereinafter, FIGS. 3 to 5 will be referred to again and FIG. 10 will also be referred to. FIG. 10 is an enlarged cross-sectional view of the film forming device illustrated in FIG. 3M which an enlarged cross-sectional view of a portion in which a plasma generating unit is provided is illustrated in an enlarged scale. As illustrated in FIGS. 3 to 5, and 10, the film forming device 10 includes a plasma generating unit 22. The plasma generating unit 22 supplies a processing gas to the second regions R2 and supplies the microwave to the second regions R2 so that the plasma of the processing gas is generated in the second regions R2. When the method (MT1) is carried out in the film forming device 10, a precursor gas (DCS) based reactant which is chemisorbed onto a wafer W may be nitrided in the second regions R2.

The plasma generating unit 22 may have one or more antennas 22a which supply the microwave to the second regions R2. Each of the one or more antennas 22a may include a dielectric plate 40 and one or more waveguides 42. In the exemplary embodiment illustrated in FIGS. 3 to 5, four antennas 22a are arranged in a circumferential direction with respect to the axis X. Each antenna 22a includes a dielectric plate 40 which is provided above one of the second regions R2 and a waveguide 42 which is provided on the dielectric plate 40.

Figure 11:
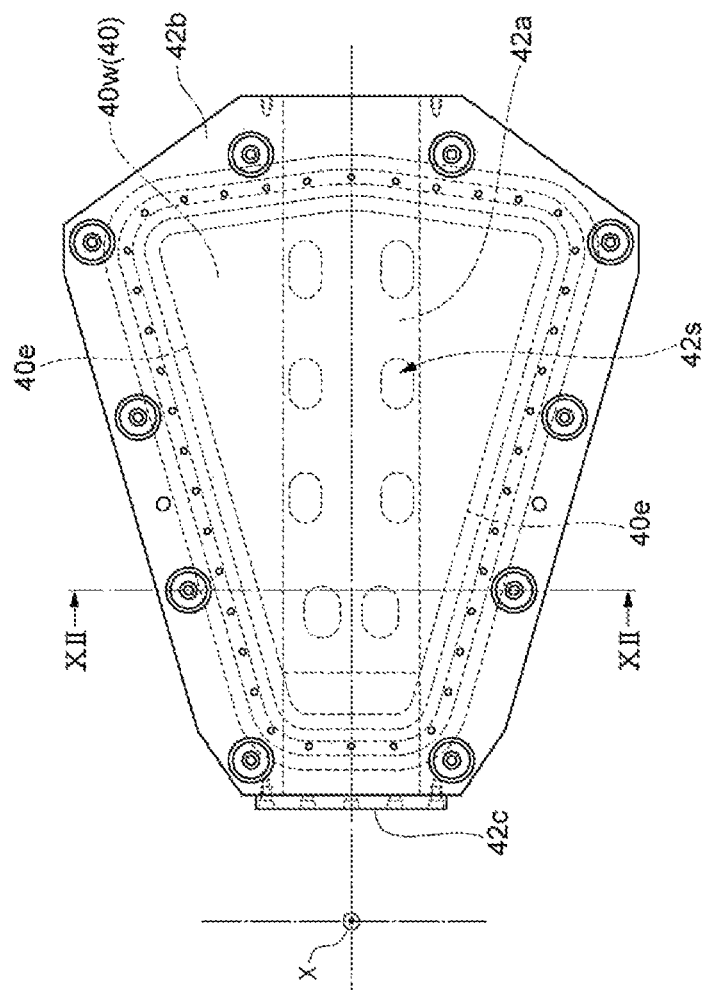
FIG. 11 is a top plan view of one antenna of a film forming device according to an exemplary embodiment.
Figure 12:
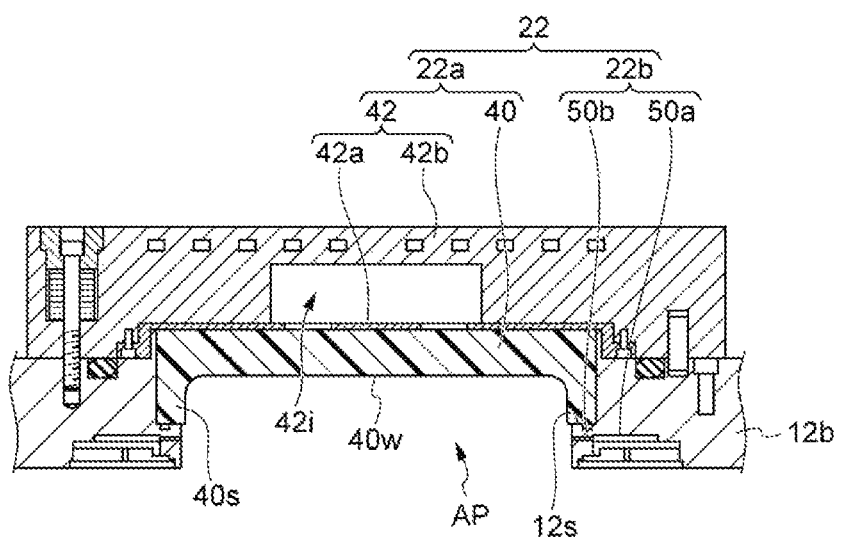
FIG. 12 is a cross-sectional view taken along line XII-XII of FIG. 11.

Here, reference will also be made to FIGS. 11 and 12. FIG. 11 is a top plan view of an antenna of the film forming device according to an exemplary embodiment. FIG. 12 is a cross-sectional view taken along line XII-XII of FIG. 11. As illustrated in FIGS. 10 to 12, the dielectric plate 40 is a substantially plate-shaped member which is formed of a dielectric material such as quartz. The dielectric plate 40 is provided to face one of the second regions R2 and supported by the upper portion 12b of the processing container 12.

Specifically, the upper portion 12b of the processing container 12 is formed with an aperture AP so as to expose the dielectric plate 40 to the second region R2. A planar size (an in-plane size intersecting the axis X) of an upper portion of the aperture AP is set to be larger than a planar size (an in-plane size intersecting the axis X) of a lower portion of the aperture AP. Therefore, a stepped surface 12s which faces the top side is provided in the upper portion 12b which is formed with the aperture AP. Meanwhile, an edge of the dielectric plate 40 serves as a portion 40s to be supported and abuts against the stepped surface 12s. When the portion 40s to be supported abuts against the stepped surface 12s, the dielectric plate 40 is supported by the upper portion 12b. Meanwhile, an elastic sealing member may be provided between the stepped surface 12s and the dielectric plate 40.

As described above, the dielectric plate 40 which is supported by the upper portion 12b faces the mounting table 14 with the second region R2 being interposed therebetween. A portion of the bottom surface of the dielectric plate 40 which is exposed through the aperture AP of the upper portion 12b, that is, a portion which faces the second region R2 serves as a dielectric window 40w. The edges of the dielectric window 40w include two edges 40e which approach each other toward the axis X. The shape of the dielectric window 40w, that is, a shape where a length of the circumferential direction is increased as being distant from the axis X may reduce a variation in time of allowing respective positions on a wafer W to be exposed to the plasma of the processing gas. Meanwhile, a planar shape of the dielectric plate 40 which includes the dielectric window 40w and the portion 40s to be supported may be a substantially fan shape or a polygonal shape so that the dielectric plate may be easily machined.

The waveguide 42 is provided on the dielectric plate 40. The waveguide 42 is a rectangle waveguide and is provided on the dielectric plate 40 such that an inner space 42i to which the microwave propagates extends in a substantially radial direction with respect to the axis X from the top side of the dielectric window 40w. According to the exemplary embodiment, the waveguide 42 may include a slot plate 42a, an upper member 42b, and an edge member 42c.

The slot plate 42a is a plate-like member which is formed of a metal and the inner space 42i of the waveguide 42 is formed from the bottom side. The slot plate 42a abuts against the top surface of the dielectric plate 40 to cover the top surface of the dielectric plate 40. The slot plate 42a has a plurality of slot holes 42s in a portion which forms the inner space 42i.

A metallic upper member 42b is provided on the slot plate 42a to cover the slot plate 42a. The upper member 42b forms the inner space 42i of the waveguide 42 from the top side. The upper member 42b may be fixed to the upper portion 12b using a screw so that the slot plate 42a and the dielectric plate 40 are clamped between the upper member 42b and the upper portion 12b of the processing container 12.

The edge member 42c is a metallic member and is provided at one end of the waveguide 42 in a longitudinal direction. That is, the edge member 42c is attached to the slot plate 42a and one end of the upper member 42b so as to close one end of the inner space 42i. A microwave generator 48 is connected to the other end of the waveguide 42. The microwave generator 48 generates a microwave of, for example, approximately 2.45 GHz and supplies the microwave to the waveguide 42. The microwave which is generated by the microwave generator 48 to propagate in the waveguide 42 passes through the slot hole 42s of the slot plate 42a to be supplied to the dielectric plate 40 and supplied to the second region R2 through the dielectric window 40w. According to the exemplary embodiment, the microwave generator 48 may be shared by the plurality of waveguides 42. Further, according to another exemplary embodiment, a plurality of microwave generators 48 may be connected to the plurality of waveguides 42, respectively. As described above, one or more microwave generators 48 which are connected to the plurality of antennas 22a are used and the intensity of the microwave generated by the microwave generator 48 is adjusted so that the intensity of the microwave which is applied to the second region R2 may be increased.

The plasma generating unit 22 includes a third gas supplying unit 22b. The third gas supplying unit 22b supplies the processing gas to the second region R2. When the method (MT1) is carried out in the film forming device 10, the processing gas includes ammonia gas and hydrogen gas. According to the exemplary embodiment, the third gas supplying unit 22b may include a gas supply path 50a and an injection nozzle 50b. The gas supply path 50a is formed in the upper portion 12b of the processing container 12, for example, so as to extend around the aperture AP. Further, the injection nozzle 50b is formed in the upper portion 12b of the processing container 12 so as to inject the processing gas which is supplied to the gas supply path 50a below the dielectric window 40w. According to the exemplary embodiment, the plurality of injection nozzles 50b may be formed around the aperture AP. Further, a gas source 50g of the hydrogen gas is connected to the gas supply path 50a through a valve 50v and a flow rate controller 50c such as a mass flow controller. Furthermore, a gas source 51g of the ammonia gas is connected to the gas supply path 50a through a valve 51v or a flow rate controller 51c such as a mass flow controller.

According to the plasma generating unit 22 configured as described above, the processing gas is supplied to the second region R2 by the third gas supplying unit 22b and the microwave is supplied to the second region R2 by the antenna 22a. Accordingly, plasma of the processing gas is generated in the second region R2. In other words, the second region R2 is a region in which the plasma of the processing gas is generated. As illustrated in FIG. 5, a range of an angle at which the second region R2 extends in the circumferential direction with respect to the axis X is larger than a region of an angle at which the first region extends in the circumferential direction. The precursor gas based reactant which is chemisorbed onto the wafer W is nitrided by the plasma of the processing gas which is generated in the second region R2. In the meantime, as illustrated in FIG. 5, an exhaust port 22h is formed at the bottom side of the external edge of the mounting table 14 in the lower portion 12a of the processing container 12. An exhausting device 52 illustrated in FIG. 10 is connected to the exhaust port 22h.

Referring to FIG. 3 again, the film forming device 10 may further include a controller 60 which controls the components of the film forming device 10. The controller 60 may be a computer which includes a central processing unit (CPU), a memory, and an input device. When the CPU operates in accordance with a program which is stored in the memory, the controller 60 may control the components of the film forming device 10. According to the exemplary embodiment, the controller 60 may transmit a control signal to a driving device 24a so as to control a rotation speed of the mounting table 14, transmit a control signal to a power supply which is connected to the heater 26 so as to control a temperature of a wafer W, transmit a control signal to the valve 16v and the flow rate controller 16c so as to control the flow rate of the precursor gas, transmit a control signal to the exhausting device 34 so as to control an exhaust amount of the exhausting device 34 which is connected to the exhaust port 18a, transmit a control signal to the valve 20v and the flow rate controller 20c so as to control the flow rate of the purge gas, transmit a control signal to the microwave generator 48 so as to control a power of the microwave, transmit a control signal to the valve 50v and the flow rate controller 50c so as to control the flow rate of the hydrogen gas in the processing gas, transmit a control signal to the valve 51v and the flow rate controller 51c so as to control the flow rate of the ammonia gas in the processing gas, and transmit a control signal to the exhausting device 52 so as to control an exhaust amount of the exhausting device 52.

In the above-described film forming device 10, a plurality of wafers W may be disposed on the mounting table 14. The wafers W disposed on the mounting table 14 sequentially pass through the first regions R1 and the second regions R2 while the mounting table 14 rotates about the axis X. During a period when the wafers W pass through the first regions R1, step S1 of the method (MT1) is performed. Further, when the wafer Ws move from the first regions R1 to the second regions R2, step S2 of the method (MT1) is performed on the wafers W between the first regions R1 and the second regions R2. During a period when the wafers W pass through the second regions R2, step S3 of the method (MT1) is performed. Further, when the wafers W move from the second regions R2 to the first regions R1, step S5 of the method (MT1) is performed on the wafers W between the second regions R2 and the first regions R1. As described above, according to the film forming device 10, the method (MT1) may be simultaneously performed on the plurality of wafers W. Therefore, according to the method (MT1) which is carried out using the film forming device 10, a throughput of nitride film formation may be further improved.

According to another exemplary embodiment, the antenna 22a may be replaced by a microwave supplying antenna which is called a radial line slot array antenna.

Figure 13:
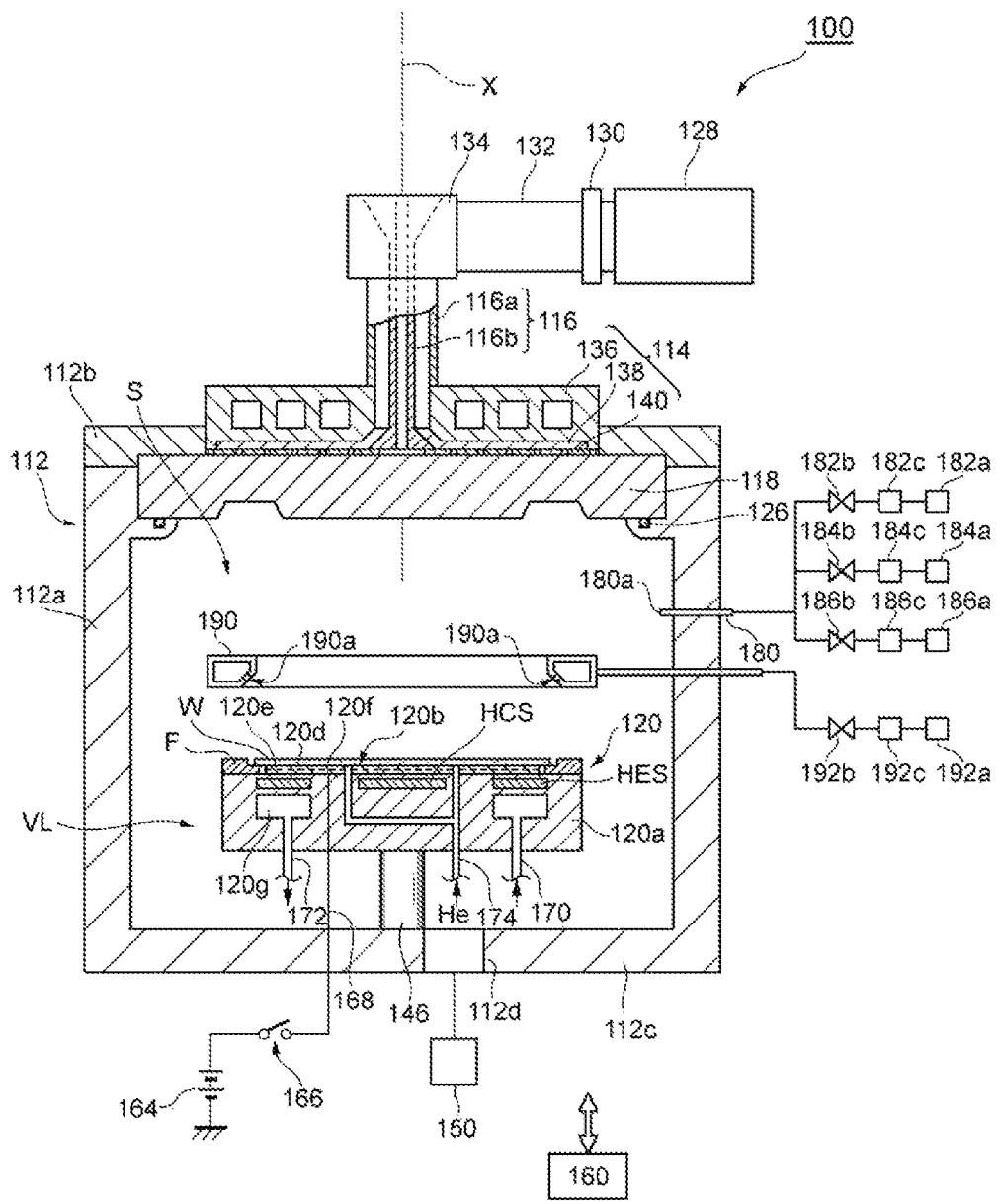
FIG. 13 is a view illustrating another example of a film forming device which is used to carry out the method illustrated in FIG. 1.

Hereinafter, another example of a film forming device which is used to carry out the method (MT1) will be described. FIG. 13 is a view illustrating another example of a film forming device which is used to carry out the method (MT1). The film forming device 100 illustrated in FIG. 13 is a so-called sheet type film forming device and includes a processing container 112.

A processing space S in which a wafer W is accommodated is formed in the processing container 112. The processing container 112 may include a side wall 112a, a ceiling portion 112b, and a bottom portion 112c. The side wall 112a has a substantially cylinder shape which extends in a direction in which the axis X extends (hereinafter, referred to as an "axis X direction"). The bottom portion 112c is provided at the bottom end of the side wall 112a. The top end of the side wall 112a is opened. The top opening of the side wall 112a is closed by a top plate 118 which is made of a dielectric material. The top plate 118 is clamped between the top end of the side wall 112a and the ceiling portion 112b. A sealing member 126 may be interposed between the top plate 118 and the top end of the side wall 112a. The sealing member 126 is, for example, an O ring and contributes to sealing the processing container 112.

The film forming device 100 further includes a stage 120 which is provided in the processing container 112. The stage 112 is provided below the top plate 118. According to the exemplary embodiment, the stage 120 includes a table 120a and an electrostatic chuck 120b.

The table 120a is supported by the bottom portion 112c by a supporting unit 146 which extends in the axis X direction. An exhaust path VL is formed between a side surface of the table 120a and the side wall 112a and between the bottom surface of the table 120a and the bottom portion 112c. The exhaust path VL is connected to an exhaust port 112d which is provided on the bottom portion 112c. An exhausting device 150 is connected to the exhaust port 112d. The exhausting device 150 includes a vacuum pump such as a turbo molecular pump and a pressure regulator. The pressure of a processing spacer S in the processing container 112 may be adjusted to a desired pressure by the exhausting device 150. Further, when the exhausting device 150 is operated, a gas may be exhausted from an outer periphery of the stage 120 through the exhaust path VL.

The electrostatic chuck 120b is provided on the top surface of the table 120a. According to the exemplary embodiment, the top surface of the electrostatic chuck 120b configures a mounting area in which a wafer W is disposed. The electrostatic chuck 120b maintains the wafer W by an electrostatic attraction force. A focus ring F which radially encloses the periphery of the wafer W is provided radially outside the electrostatic chuck 120b. The electrostatic chuck 120b includes an electrode 120d, an insulating layer 120e, and an insulating layer 120f. The electrode 120d is configured by a conductive layer and provided between the insulating layer 120e and the insulating layer 120f. A high voltage direct current (DC) power supply 164 is electrically connected to the electrode 120d through a switch 166 and a coated wire 168. The electrostatic chuck 120b may attract and maintain the wafer W on the top surface thereof by a coulomb force which is generated by a DC voltage which is applied from the direct current power supply 164.

A circular coolant chamber 120g which circumferentially extends is provided in the table 120a. A coolant at a predetermined temperature, for example, cooling water is circulated and supplied to the coolant chamber 120g from a chiller unit through pipes 170 and 172. A processing temperature of the wafer W on the electrostatic chuck 120b may be controlled by the temperature of the coolant. Further, a heat transfer gas from a heat transfer gas supplying unit, for example, He gas, is supplied between the top surface of the electrostatic chuck 120b and the rear surface of the wafer W through a gas supplying tube 174.

According to the exemplary embodiment, the film forming device 100 may further include a heater (HCS or HES) as a temperature control mechanism. The heater HCS is provided in the table 120a. The heater HCS is provided in a central area in the table 120a, that is, in an area which intersects the axis X. Further, the heater HES radially extends in the table 120a so as to enclose the heater HES.

The film forming device 100 may further include an antenna 114, a coaxial waveguide 116, a top plate 118, a microwave generator 128, a tuner 130, a waveguide 132, and a mode converter 134. The microwave generator 128 generates a microwave having a frequency of, for example, 2.45 GHz. The microwave generator 128 is connected to an upper portion of the coaxial waveguide 116 through the tuner 130, the waveguide 132, and the mode converter 134. The coaxial waveguide 116 extends along the axis X which is a central axis. The coaxial waveguide 116 includes an outer conductor 116a and an inner conductor 116b. The outer conductor 116a has a tube shape which extends in the axis X direction. A lower end of the outer conductor 116a may be electrically connected to an upper portion of a cooling jacket 136 which has a conductive surface. The inner conductor 116b is provided inside the outer conductor 116b. The inner conductor 116b extends along the axis X. A lower end of the inner conductor 116b is connected to a slot plate 140 of the antenna 114.

The antenna 114 may be disposed in an aperture which is formed on the ceiling portion 112b. The antenna 114 includes a slow wave plate 138 and a slot plate 140. The slow wave plate 138 shortens a wavelength of the microwave and has a substantially disc shape. The slow wave plate 138 is formed of, for example, quartz or alumina. The slow wave plate 138 is clamped between the slot plate 140 and the bottom surface of the cooling jacket 136. Therefore, the antenna 114 may be configured by the slow wave plate 138, the slot plate 140, and the bottom surface of the cooling jacket 136.

Figure 14:
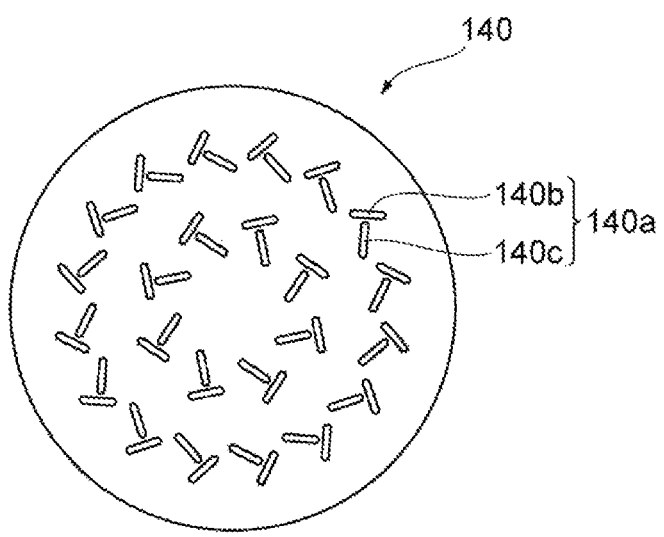
FIG. 14 is a plan view illustrating a slot plate of the film forming device illustrated in FIG. 13.

The slot plate 140 is a substantially disc-shaped metal plate in which a plurality of slot pairs are formed and the antenna 114 may be a radial line slot array antenna. FIG. 14 is a plan view illustrating the slot plate of the film forming device illustrated in FIG. 13. A plurality of slot pairs 140a is formed on the slot plate 140. The plurality of slot pairs 140a are provided at predetermined intervals in the radial direction and also disposed at predetermined intervals in the circumferential direction. Each of the plurality of slot pairs 140a includes two slot holes 140b and 140c. The slot hole 140b and the slot hole 140c extend in an intersecting or perpendicular direction.

Reference will be made to FIG. 13 again. In the film forming device 100, the microwave generated by the microwave generator 128 is propagated to the slow wave plate 138 through the coaxial waveguide 116 and reaches the top plate 118 from the slot holes 140b and 140c of the slot plate 140.

The top plate 118 has a substantially disc shape and, for example, is formed of quartz or alumina. The top plate 118 is provided immediately below the slot plate 140. The top plate 118 transmits the microwave received from the antenna 114 so that the microwave is introduced into the processing space S. Therefore, an electric field is generated immediately below the top plate 118 and plasma is generated in the processing space.

In the film forming device 100, a gas supplying unit 180 is attached to the side wall 112a. One end 180a of the gas supplying unit 180 is opened within the processing container 112. A gas source 182a is connected to the other end of the gas supplying unit 180 through a valve 182b and a flow rate controller 182c such as a mass flow controller. Further, a gas source 184a is connected to the other end of the gas supplying unit 180 through a valve 184b and a flow rate controller 184c such as a mass flow controller. Furthermore, a gas source 186a is connected to the other end of the gas supplying unit 180 through a valve 186b and a flow rate controller 186c such as a mass flow controller. The gas sources 182a, 184a, and 186a are a gas source of hydrogen gas, a gas source of ammonia gas, and a gas source of purge gas, respectively. The hydrogen gas from the gas source 182a and the ammonia gas from the gas source 184a are processing gases which are used in step S3 of the method (MT1). Further, the purge gas from the gas source 186a is used in steps S2 and S5 of the method (MT1). Further, as for the purge gas, an inert gas, for example, nitrogen ($N_2$) gas or a rare gas such as argon (Ar) gas may be used.

A gas supplying unit 190 is provided on the stage 120 in the processing container 112 in which the gas supplying unit 190 extends in the circumferential direction with respect to the axis X. The gas supplying unit 190 is an annular tube and a plurality of gas injection nozzles 190a which are opened toward the stage 120 is formed in the gas supplying unit 190. A gas source 192a is connected to the gas supplying unit 190 through a valve 192b and a flow rate controller 192c such as a mass flow controller. The gas source 192a is a gas source of a precursor gas, that is, DCS when the method (MT1) is carried out.

The film forming device 10 may further include a controller 160. The controller 160 may be a controller such as a programmable computer device. The controller 160 transmits control signals to the flow rate controllers 182c, 184c, 186c, and 192c so as to control a flow rate of the gas from each of the gas sources 182a, 184a, 186a, and 192a. Further, the controller 160 may supply control signals to the microwave generator 128 and the exhausting device 150 so as to control the power of the microwave and the pressure within the processing container 12. Further, the controller 160 may transmit a control signal to a power supply which is connected to the heaters HCS and HES so as to adjust the temperature of a wafer W.

When the method (MT1) is carried out in the film forming device 100, a wafer W is exposed to the DCS supplied from the gas source 192a to be injected by the gas supplying unit 190 in step S1. Next, in step S2, the purge gas is supplied from the gas source 186a to the processing space S and the processing space S is exhausted by the exhausting device 150. Next, in step S3, the processing gas which includes the hydrogen gas from the gas source 182a and the ammonia gas from the gas source 184a is supplied to the processing space S and a microwave is introduced into the processing space S from the antenna 114 through the top plate 118. As a result, the plasma of the processing gas is generated and the DCS based reactant which is adsorbed onto the wafer W is nitrided by the plasma of the processing gas. Even when the film forming device 100 is used, steps S1 to S3 are repeated predetermined times after performing step S5. As described above, the method (MT1) may be carried out also in a sheet type film forming device 100.

Hereinafter, Test Examples which were performed in order to evaluate the method (MT1) will be described. The Test Examples described below were performed using the film forming device 100 illustrated in FIGS. 13 and 14.

Test Examples 1 to 3 and Comparative Test Examples 1 to 3

In Test Examples 1 to 3, the method (MT1) was carried out on wafers W. In Test Examples 1 to 3, steps S1 to S5 were repeated 200 cycles. Further, in Test Examples 1 to 3, the lengths of processing time at step S3 were 5 seconds, 15 seconds, and 30 seconds, respectively. Other conditions of Test Examples 1 to 3 were as follows and common to Test Examples 1 to 3.

(Condition of Step S1 of Test Examples 1 to 3)

| Flow rate of DCS | 280 sccm |
|---|---|
| Processing time | 5 seconds |
| Pressure in processing container | 5 Torr (666.6 Pa) |

(Condition of step S3 of Test Examples 1 to 3)

| Flow rate of ammonia ($NH_3$) gas | 200 sccm |
|---|---|
| Flow rate of hydrogen ($H_2$) gas | 700 sccm |

| | |
|---|---|
| Pressure in processing container | 5 Torr (666.6 Pa) |
| Power of microwave | 4,000 W |

For the comparison, Comparative Test Examples 1 to 3 were performed in which Comparative Test Examples 1 to 3 were different from Test Examples 1 to 3 in that nitrogen ($N_2$) gas was used instead of the ammonia ($NH_3$) gas of step S3. The nitriding time in Comparative Test Examples 1 to 3, that is, the lengths of time of exposing the wafers W to the plasma of the processing gas including $N_2$ gas and $H_2$ gas were 10 seconds, 30 seconds, and 60 seconds, respectively. Further, in Comparative Test Examples 1 to 3, the flow rate of the $N_2$ gas in the processing gas was 300 sccm and the flow rate of the $H_2$ gas in the processing gas was 700 sccm.

Next, WERRs of nitride films formed in Test Examples 1 to 3 and Comparative Test Examples 1 to 3 were obtained. Meanwhile, the "WERR" is a scale of quality of a film to be evaluated and refers to a ratio of a wet etching rate of a film to be evaluated by hydrofluoric acid with respect to a wet etching rate of a thermally oxidized film by hydrofluoric acid.

Figure 15A:
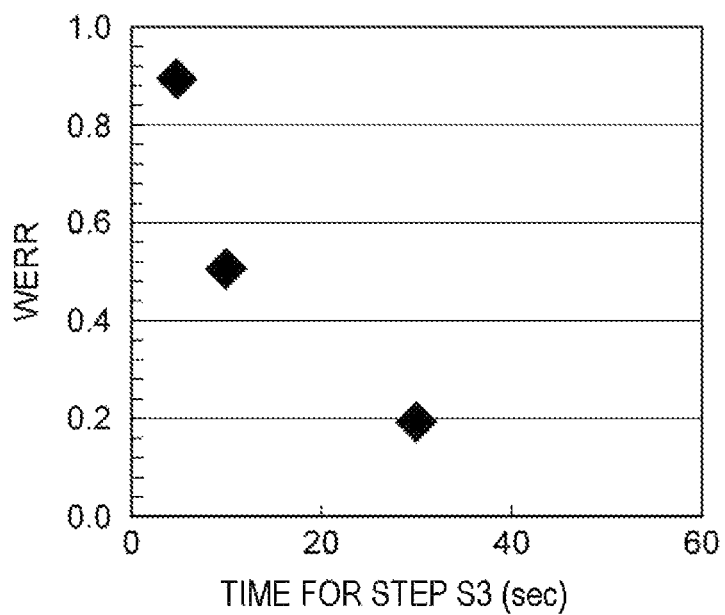
FIGS. 15A and 15B are graphs illustrating WERRs of nitride films produced in Text Examples 1 to 3 and Comparative Test Examples 1 to 3.
Figure 15B:
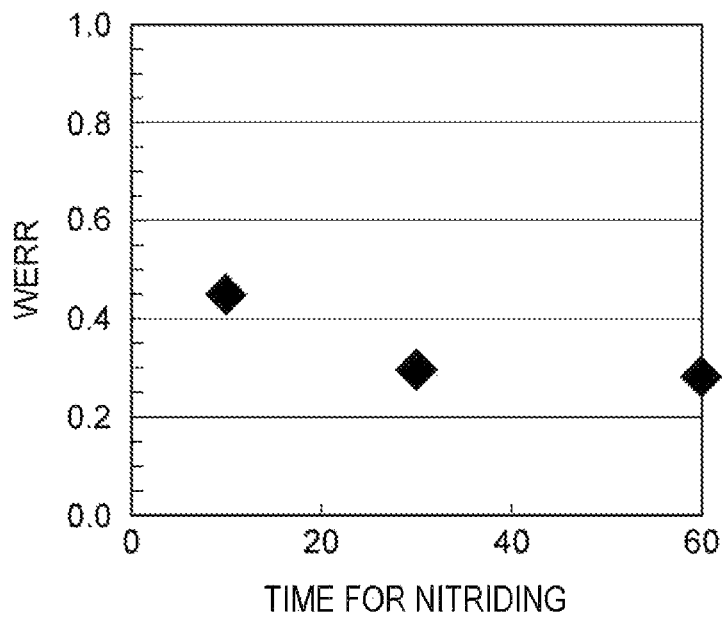

The WERRs of the nitride films formed in Test Examples 1 to 3 and Comparative Test Examples 1 to 3 are illustrated in FIG. 15. The graph illustrated in FIG. 15A illustrates the WERRs of the nitride films of Test Examples 1 to 3 and the graph illustrated in FIG. 15B illustrates the WERRs of the nitride films of Comparative Test Examples 1 to 3. As clearly understood from the graph of FIG. 15B, it was confirmed that the limitation of the WERRs is 0.23 in the plasma of the processing gas which includes the $N_2$ gas and the $H_2$ gas even when the nitriding time was increased to 60 seconds. As illustrated in FIG. 15A, it was confirmed that according to the method (MT1), when the processing time of step S3 was 30 seconds, the WERR was 0.2 so that a nitride film of high quality may be obtained.

Comparative Test Examples 4 to 7

Figure 16A:
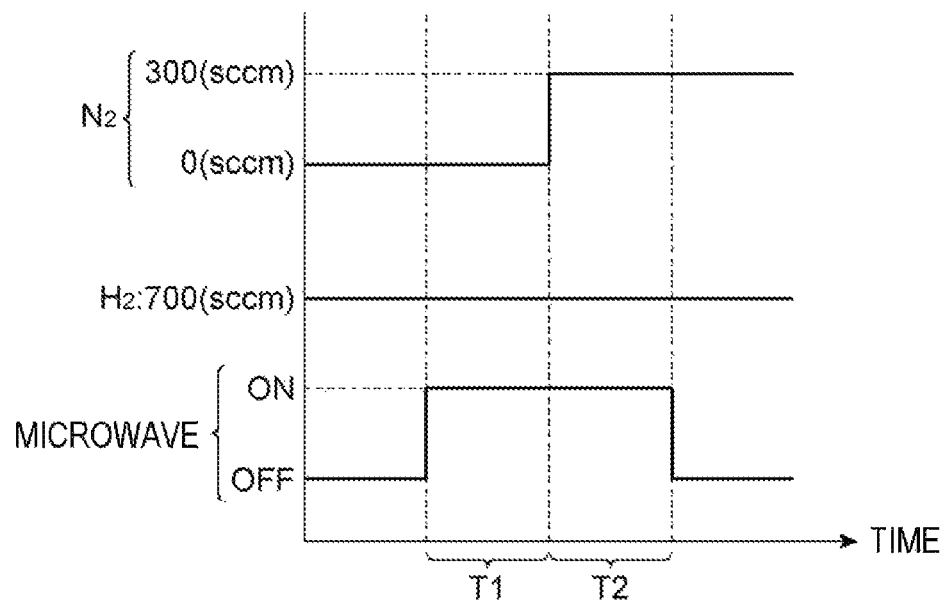
FIGS. 16A and 16B are views illustrating a nitriding process of Comparative Test Examples 4 to 7 and test results of the Comparative Test Examples 4 to 7.

For the comparison, as illustrated in FIG. 16A, Comparative Test Examples 4 to 7 were performed. The Comparative Test Examples 4 to 7 were different from Comparative Test Examples 1 to 3 in that in the nitriding process, wafers W were exposed to the plasma of $H_2$ gas and then the wafers W were exposed to the plasma of the processing gas including the $N_2$ gas and the $H_2$ gas. In Comparative Test Examples 4 to 7, in the ON state, the power of the microwave was 4,000 W. In Comparative Test Examples 4 to 7, the lengths of time T1 of allowing wafers W to be exposed to the plasma of $H_2$ gas/the lengths of time T2 of allowing wafers W to be exposed to the plasma of the processing gas including the $N_2$ gas and the $H_2$ gas were 0 second/30 seconds, 10 seconds/20 seconds, 20 seconds/10 seconds, and 0 second/10 seconds, respectively.

Figure 16B:
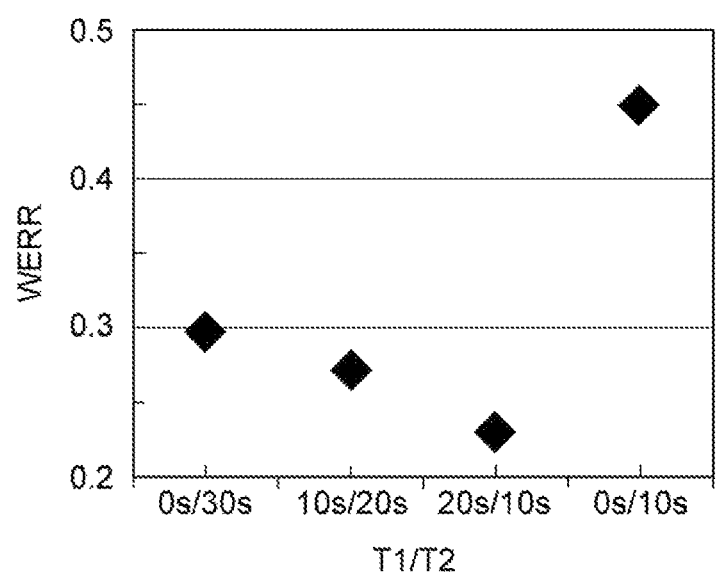

The WERRs of the nitride films obtained in Comparative Test Examples 4 to 7 are illustrated in FIG. 16B. As illustrated in FIG. 16B, in Comparative Test Examples 4 to 7, it was confirmed that even when the length of time T1 and the length of time T2 were adjusted under the limitation that the sum of both of them, i.e. (T1+T2), was within the range of 30 seconds, the smallest WERR was larger than 0.2. As clearly understood from the comparison of the results of Comparative Test Examples 4 to 7 with the result of Test Example 3, it was confirmed that according to the method (MT1), a nitride film of high quality in which WERR=0.2 may be obtained when step S3 is carried out for 30 seconds.

Test Examples 4 to 8

In Test Examples 4 to 8, the method (MT1) was carried out on the wafer W. In Test Examples 4 to 8, steps S1 to S5 were repeated at 200 cycles. Further, in Test Examples 4 to 8, the processing time of step S3 was 30 seconds and the flow rate of the $H_2$ gas was 700 sccm. Further, in Test Examples 4 to 8, the flow rates of the $NH_3$ gas in step S3 were 600 sccm, 400 sccm, 200 sccm, 100 sccm, and 50 sccm, respectively. Other conditions of Test Examples 4 to 8 were equal to the conditions of Test Examples 1 to 3.

Then, the WERRs of the nitride films which were created in Test Examples 4 to 6 were obtained. Further, in Test Examples 4 to 8, an optical emission spectrophotometer (OES) was used to measure a ratio of an emission intensity of hydrogen (H) and an emission intensity of ammonia radical (NH) in step S3, that is, (emission intensity of H)/(emission intensity of NH).

Figure 17A:
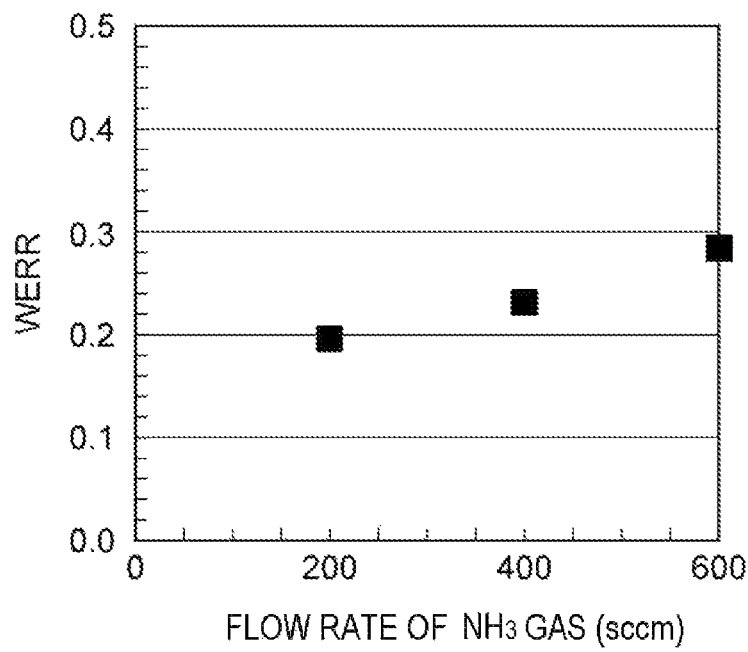
FIGS. 17A and 17B are views illustrating WERRs of nitride films produced in Test Examples 4 to 6 and OES emission intensity ratios of Test Examples 4 to 8.
Figure 17B:
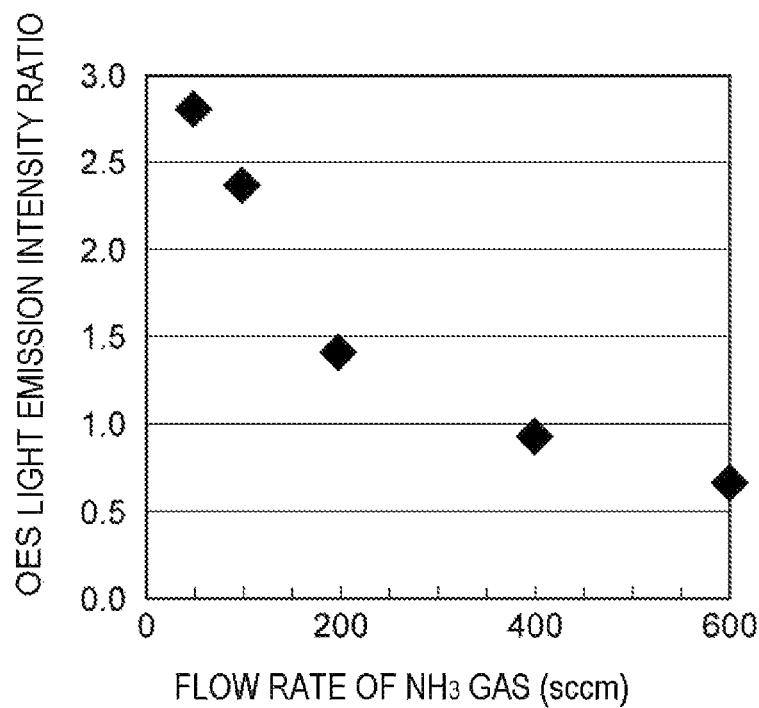

FIG. 17A represents the WERRs of the nitride films which were formed in Test Examples 4 to 6 and FIG. 17B represents OES emission intensity ratios of (emission intensity of H)/(emission intensity of NH) in step S3 of Test Examples 4 to 8. As clearly understood from FIG. 17A, as the results of Test Examples 4 to 6, it was confirmed that when the flow rate of the $NH_3$ gas is relatively reduced with respect to the flow rate of the $H_2$ gas, a nitride film with a small WERR, that is, a nitride film of high quality may be obtained. Further, as illustrated in FIG. 17B, it was confirmed that when the flow rate of the $NH_3$ gas is equal to or lower than 200 sccm with respect to the flow rate of the $H_2$ gas of 700 sccm the emission intensity ratio is increased, that is, the amount of hydrogen radicals is increased. From the above result, it was confirmed that when the flow rate of the $NH_3$ gas is set to be equal to or lower than 200 sccm with respect to the flow rate of the $H_2$ gas of 700 sccm, the amount of the hydrogen radicals may increase and further, a nitride film of may be obtained.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of forming a nitride film on an object to be processed, the method comprising:
    exposing the object to be processed to dichlorosilane which is a precursor gas so that a dichlorosilane based first reactant is chemisorbed onto the object to be processed;
    exposing the object to be processed to plasma of a processing gas which includes an ammonia gas and a hydrogen gas after the exposing of the object to be processed to the dichlorosilane;
    exciting each of the hydrogen gas and the ammonia gas thereby generating a hydrogen radical and an ammonia radical;
    removing a chlorine in the first reactant through a hydrogen substitution reaction of the first reactant and the hydrogen radical thereby generating a second reactant; and
    performing a nitriding reaction of the second reactant and the ammonia radical thereby generating the nitride film.

2. The method of claim 1, wherein:
    exposing the object to be processed to the dichlorosilane and exposing the object to be processed to the plasma of the processing gas are alternately repeated, and
    the method further comprising removing the dichlorosilane between exposing the object to be processed to the dichlorosilane and subsequent exposing the object to be processed to the plasma of the processing gas.

3. The method of claim 1, wherein:
with respect to a flow rate of a hydrogen gas in exposing the object to be processed to the plasma of the processing gas, a flow rate of the ammonia gas in exposing the object to be processed to the plasma of the processing gas is smaller than a flow rate which is defined as follows:
a flow rate of the hydrogen gas:a flow rate of the ammonia gas=7:2.

4. The method of claim 1, wherein the object to be processed is disposed on a mounting table which is provided to be rotatable about an axis in a processing container and sequentially passes through a first region and a second region in the processing container about the axis in accordance with rotation of the mounting table, the dichlorosilane is supplied to the first region, and the plasma of the processing gas is generated in the second region.

5. The method of claim 1, wherein the processing gas is excited by a microwave.

\* \* \* \* \*